United States Patent [19]

Seyyedy

[11] Patent Number: 5,719,813
[45] Date of Patent: Feb. 17, 1998

[54] CELL PLATE REFERENCING FOR DRAM SENSING

[75] Inventor: Mirmajid Seyyedy, Boise, Id.

[73] Assignee: Micron Technology, Inc., Boise, Id.

[21] Appl. No.: 471,861

[22] Filed: Jun. 6, 1995

[51] Int. Cl.$^6$ ............................................. G11C 11/24
[52] U.S. Cl. ...................... 365/205; 365/149; 365/203
[58] Field of Search .............................. 365/205, 149, 365/202, 203, 207, 102

[56] References Cited

U.S. PATENT DOCUMENTS

| | | | |
|---|---|---|---|
| 4,715,015 | 12/1987 | Mimoto et al. | 365/149 |
| 5,241,503 | 8/1993 | Cheng | 365/149 |
| 5,309,392 | 5/1994 | Ootsuka et al. | 365/149 |
| 5,367,481 | 11/1994 | Takase | 365/149 |

*Primary Examiner*—Tan T. Nguyen
*Attorney, Agent, or Firm*—Schwegman, Lundberg, Woessner & Kluth, P.A.

[57] ABSTRACT

An integrated circuit dynamic memory device is described which stores data in memory cells as a charge on a capacitor. The memory cells have a common cell plate and can be selectively connected to a digit line. Sensing circuitry, including both p-sense and n-sense amplifiers, is connected to the digit line and the cell plate. Equalization circuitry is described to equalize the cell plate and digit line for sensing data stored on a memory cell. Isolation circuitry is described for selectively isolating the sensing circuitry from the memory cells.

14 Claims, 6 Drawing Sheets

CELL PLATE REFERENCING FOR DRAM SENSING

TECHNICAL FIELD OF THE INVENTION

The present invention relates generally to dynamic memory integrated circuits and in particular the present invention relates to sensing circuits therein.

BACKGROUND OF THE INVENTION

Integrated circuit memories have become increasingly dense as the need for more memory storage increases. While fabrication techniques and design options have been fairly successful in maintaining steady increases in memory storage from design generation to generation, the need for new highly populated circuits continues.

A dynamic random access memory (DRAM) device is comprised of an arrangement of individual memory cells. Each memory cell comprises a capacitor capable of holding a charge and an access transistor for accessing the capacitor charge. The charge is referred to as a data bit and can be either a high voltage or a low voltage. Data can be either stored in the memory cells during a write mode, or data may be retrieved from the memory cells during a read mode. The data is transmitted on signal lines, referred to as digit lines, which are coupled to input/output lines through transistors used as switching devices. For each bit of data stored, its true logic state is available on an I/O line and its complementary logic state is available at on an I/O compliment line. Thus, each memory cell has two digit lines, digit and digit complement.

Typically, the memory cells are arranged in an array and each cell has an address identifying its location in the array. The array comprises a configuration of intersecting rows and a memory cell is associated with each intersection. In order to read from or write to a cell, the particular cell in question must be selected, or addressed. The address for the selected cell is represented by input signals to a row decoder and to a column decoder. The row decoder activates a word line in response to the row address. The selected word line activates the access transistors for each of the memory cells in communication with the selected word line. The column decoder selects a digit line pair in response to the column address. For a read operation the selected word line activates the access transistors for a given row address, and data is latched to the digit line pairs.

Conventional dynamic memories use memory cells fabricated as capacitors in an integrated circuit to store data. That is, a logical "1" is stored as a charge on the capacitor and the capacitor is discharged for a logical "0". The pairs of digit lines are fabricated as metal lines on the integrated circuit and connected to the memory cells for transmitting data stored in the memory cells. Sense amplifiers are utilized to sense small differentials on the digit lines and drive the digit lines to full power supply rails for either reading the memory cells or writing thereto. Although unique fabrication techniques and processes have been developed to reduce the size of the memory cells and access circuitry, the physical spacing requirements for the digit line architecture creates a barrier to maximizing the available die area. That is, the reductions in memory cell size cannot be fully exploited due to the digit line pairs.

For the reasons stated above, and for other reasons stated below which will become apparent to those skilled in the art upon reading and understanding the present specification, there is a need in the art for a sensing circuitry which reduces the need for die area, thereby allowing for more densely populated memories.

SUMMARY OF THE INVENTION

The above mentioned problems with increasing the population of integrated circuit memories and other problems are addressed by the present invention and which will be understood by reading and studying the following specification. A dynamic memory circuit is described which uses sensing circuitry that reduces the number of metal digit lines needed to access the memory cells by using the common cell plate as a reference for sensing circuitry.

In particular, the present invention describes an integrated circuit which comprises an integrated circuit having a plurality of memory cell capacitors having first and second plates, the first plate being formed as a common plate, a plurality of access devices connected to the plurality of memory cell capacitors and a digit line, each for selectively connecting the second plate of one of the plurality of memory cell capacitors to the digit line, and a sense amplifier circuit selectively connected to the digit line and having a reference node selectively connected to the common plate.

The present invention can include an isolation circuit electrically located between the reference node of the sense amplifier circuit and the common plate for selectively connecting the sense amplifier circuit to the common plate. Further, the invention can include an isolation circuit electrically located between a second node of the sense amplifier circuit and the digit line for selectively connecting the sense amplifier circuit to the digit line.

An equilibrate circuit can be included for equilibrating the sense amplifier circuit. In one embodiment, this equilibrate circuit comprises a transistor having its source connected to the reference node and its drain connected to a second node of the sense amplifier circuit. In another embodiment, the equilibrate circuit comprises a transistor having its source connected to the reference node and its drain connected to the digit line. In still another embodiment the equilibrate circuit comprises a bias circuit connected to the digit line.

In yet another embodiment, a dynamic memory integrated circuit comprises a plurality of memory cell capacitors having first and second plates, the first plate being formed as a common plate, a plurality of access transistors having a gate connected to a word line, each for selectively connecting the second plate of one of the plurality of memory cell capacitors to a digit line. The memory further comprises a sense amplifier having a first node and a second node, an isolation circuit electrically located between the first node of the sense amplifier and the common plate for selectively connecting the sense amplifier to the common plate, and an isolation circuit electrically located between the second node of the sense amplifier and the digit line for selectively connecting the sense amplifier to the digit line.

One embodiment includes a method of sensing data stored in a dynamic memory cell. The method comprising the steps of connecting a first node of a sense amplifier to a common plate reference voltage, electrically connecting a second node of the sense amplifier to a digit line, imparting a differential voltage between the common plate reference voltage and a digit line voltage, and sensing the differential voltage using the sense amplifier.

Another embodiment includes a method of sensing data stored in a plurality of dynamic memory cell capacitors having a first plate and a common plate. The method comprising the steps of equilibrating a sense amplifier circuit having a first node selectively connected to the common plate and a second node selectively connected to a digit line, electrically isolating the first node of the sense amplifier circuit from the common plate, and sensing the data stored in a dynamic memory cell capacitor. The step of sensing the data stored in the dynamic memory cell capacitor can comprise the steps of selectively connecting a dynamic memory cell capacitor to the digit line, electrically isolating the second node of the sense amplifier circuit from the selected memory cell capacitor, and using the sense amplifier circuit, sensing a differential voltage between the first node and the second node.

One embodiment equilibrates the sense amplifier circuit by activating a transistor having its source connected to the first node and its drain connected to the second node, and connecting the first node to the common plate. An alternate equilibration method comprises the steps of electrically isolating the second node from the digit line, activating a transistor having its source connected to the first node and its drain connected to the digit line, electrically connecting the second node to the digit line, and connecting the first node to the common plate.

DETAILED DESCRIPTION OF THE INVENTION

In the following detailed description of the preferred embodiment, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
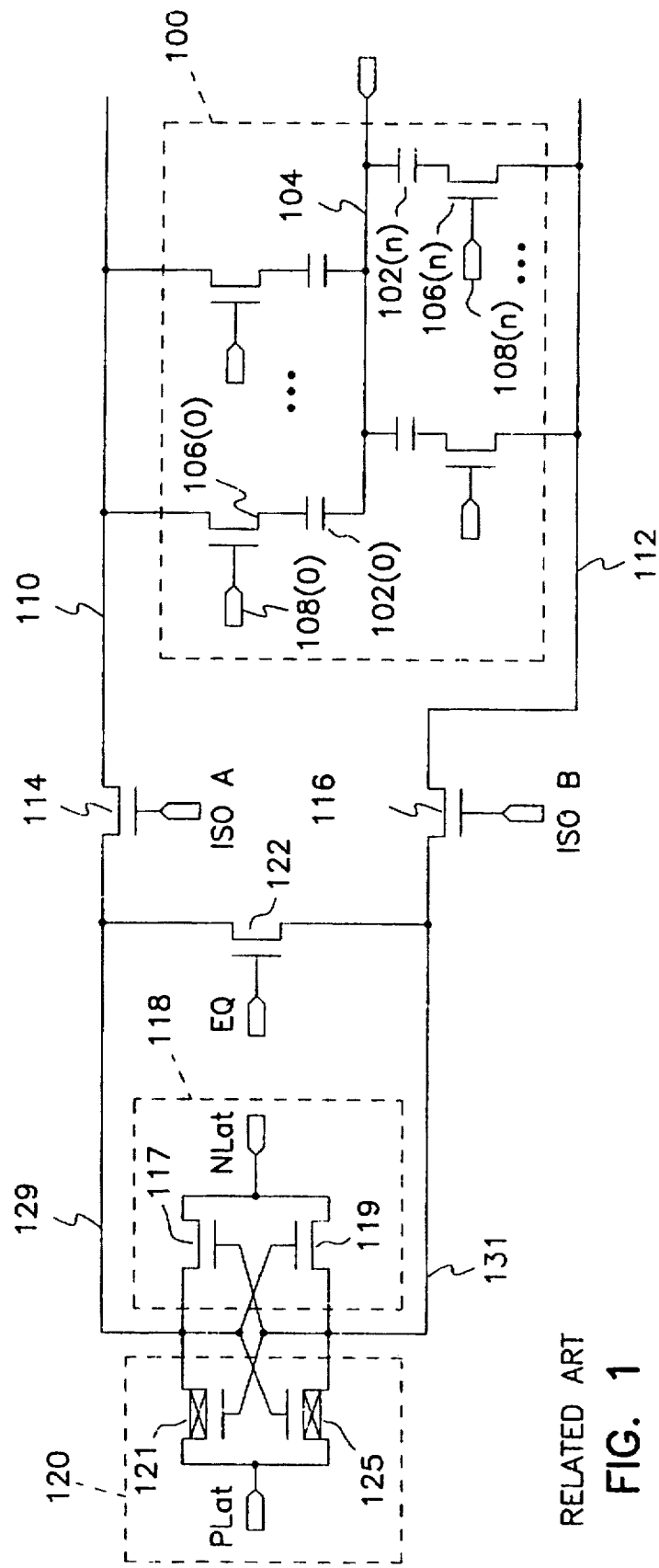
FIG. 1 is a schematic of a related memory sensing circuit.

Referring to FIG. 1, a portion of a conventional dynamic memory access circuitry is described. A memory array 100 has a plurality of memory cells 102(0)(n)-(n) which are fabricated as capacitors having one capacitive plate formed as a common cell plate 104 and the other node connected to an access transistor 106(0)-(n). Each access transistor is a n-type transistor having its gate connected to a word line 108(0)-(n). The cell plate 104 is typically biased to one-half the power supply voltage (Vcc) by a biasing source (not shown).

Digit lines 110 and 112 are each connected to some of the access transistors and memory cells. When access transistors 106 are selectively activated, the charge stored on the corresponding memory cell 102 is coupled to one of the digit lines. N-type isolation transistors 114 and 116 are used to isolate digit lines 110 and 112, respectively, from both the n-sense amp 118 and the p-sense amp 120. Equilibrate transistor 122 is used to equalize the nodes of the sense amps to the same voltage, as described below.

Figure 2:
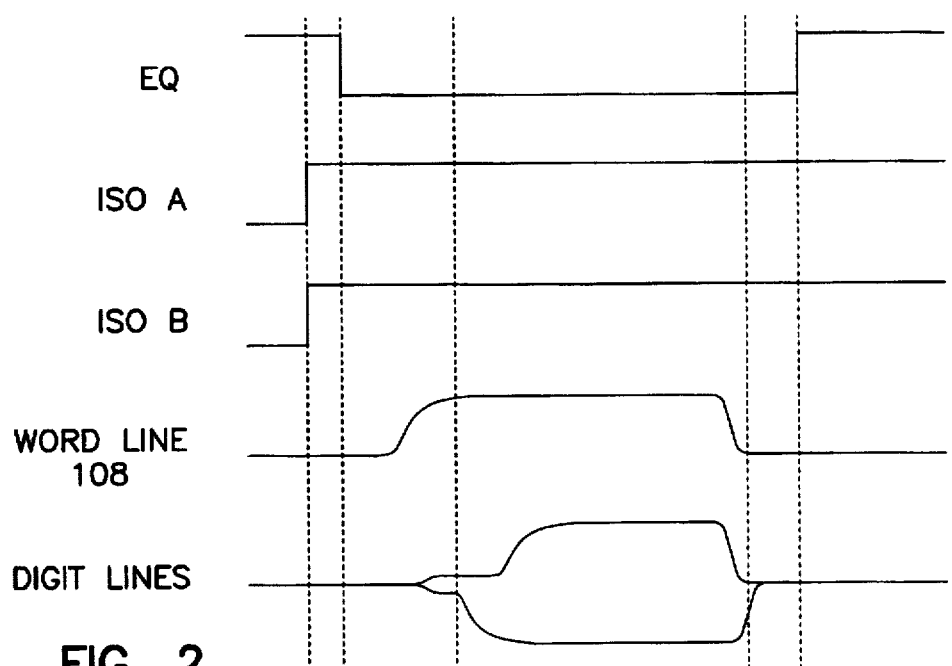
FIG. 2 is a timing diagram of the sensing circuit of FIG. 1.

In operation, data stored in the memory cells can be accessed and sensed following the process shown in FIG. 2. The first step is to equilibrate nodes 129 and 131 of sense amps 118 and 120 to Vcc/2, as sourced by a biasing circuit (not shown), by holding the gate of transistor 122 (EQ) high. The differential voltage across the sense amps is therefore zero with each node having a preferred voltage of one-half the supply voltage (Vcc). The next step is to activate isolation transistors 114 and 116 by providing their gates (ISO A and ISO B, respectively) with a high voltage. This connects the digit lines 110 and 112 to the sense amps 118 and 120 and allows the digit lines to also stabilize to Vcc/2. One of the memory cell access transistors 106(0)-(n) is then selectively activated by raising the associated word line 108(0)-(n) gate voltage. The charge, or lack of charge, stored on the selected memory cell 102 is then shared with one of the digit lines. If a logical "one" is stored on the capacitor the associated digit line will be slightly raised, for example by a voltage of approximately 100 mv. It will be understood that the charge shared with the digit line is directly dependant upon the charge stored on the memory cell. If the memory cell is un-charged the digit line voltage will drop, for example by 100 mv.

The n-sense amp 118 and the p-sense amp 120, as known to one skilled in the art, sense a differential between the digit lines and drive the digit lines to full rails in response. N-sense amp 118 has two n-channel transistors having their gates cross-coupled to the source of the other transistor. The drains of each transistor are connected together and controlled by an NLat line. The NLat line is typically pre-charged to the same level that nodes 129 and 131 have been equalized to, Vcc/2. The voltage on the NLat line is lowered to sense a high voltage on one of the nodes. Assuming for example that node 129 is 100 mv above node 131, transistor 119 will begin to turn on when the NLat drops by a threshold voltage below node 129. Node 131 will then be pulled to NLat to insure that transistor 117 does not turn on. Similarly, p-sense amp 120 has two cross-coupled p-channel transistors 121 and 125. The drains of each transistor are connected together and controlled by a PLat line. The PLat line is typically pre-charged to the same level that the nodes 129 and 131 have been equalized to, Vcc/2. The voltage on the PLat line is raised to sense a low voltage on one of the nodes. Assuming for example that node 131 is 100 mv below node 129, transistor 121 will begin to turn on when the PLat increases by a threshold voltage above node 131. Node 129 will then be pulled to PLat to insure that transistor 125 does not turn on. The NLat and PLat are strobed to full power rails, ground and Vcc, respectively. If one of the digit lines is higher, therefore, that digit line will be driven to Vcc while the complementary digit line is pulled to ground.

As seen in FIG. 2, the voltage on the digit lines are equal until shortly after the word line is activated. The n-sense amp is strobed first to drive one line low and then the p-sense amp is strobed to drive the other line high. The digit lines remain latched at these full power levels until the equilibrate transistor 122 is again activated. During the time in which the word line is high and the digit lines are latched, the memory cell is refreshed.

Figure 3:
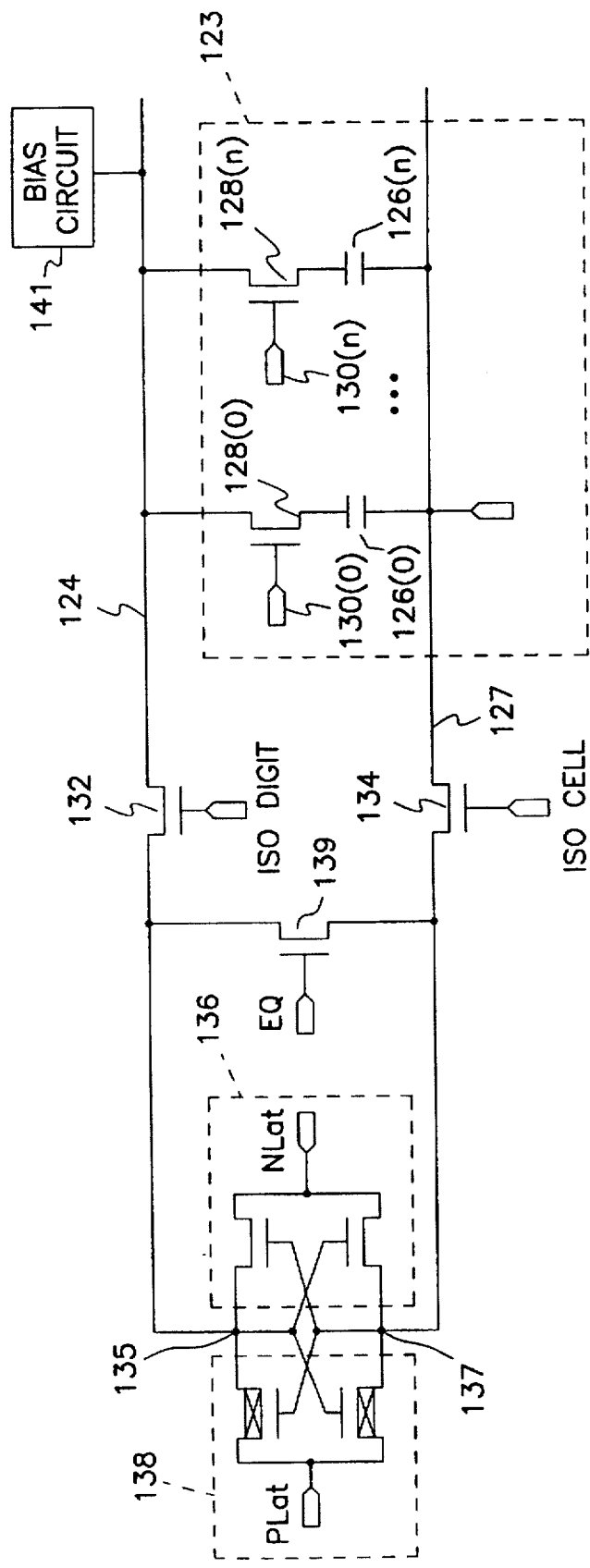
FIG. 3 is a schematic of a sensing circuit of the present invention.

As stated above, the digit lines are fabricated as metal lines which require a relatively large commitment of die area and create a barrier to increasing the density of a memory device. It would be beneficial, therefore, to reduce the number of digit lines. FIG. 3 illustrates a sensing circuit of the present invention. A memory array 123 is comprised of memory cells 126(0)-(n) fabricated as capacitors with one node connected to a common cell plate 127. The cell plate is biased to one-half Vcc by a biasing circuit (not shown). The other plate of each memory cell 126 is connected to one of the n-type access transistors 128(0)-(n). The access transistors are connected to digit line 124 and have their gate connected one of the word lines 130(0)-(n).

Isolation transistors 132 and 134 are provided to selectively isolate digit line 124 and cell plate 127, respectively, from the n-sense amp 136 and the p-sense amp 138 nodes 135 and 137. N-type equilibrate transistor 139 is provided to equalize the sense amp nodes 135 and 137 to a common voltage.

Figure 4:
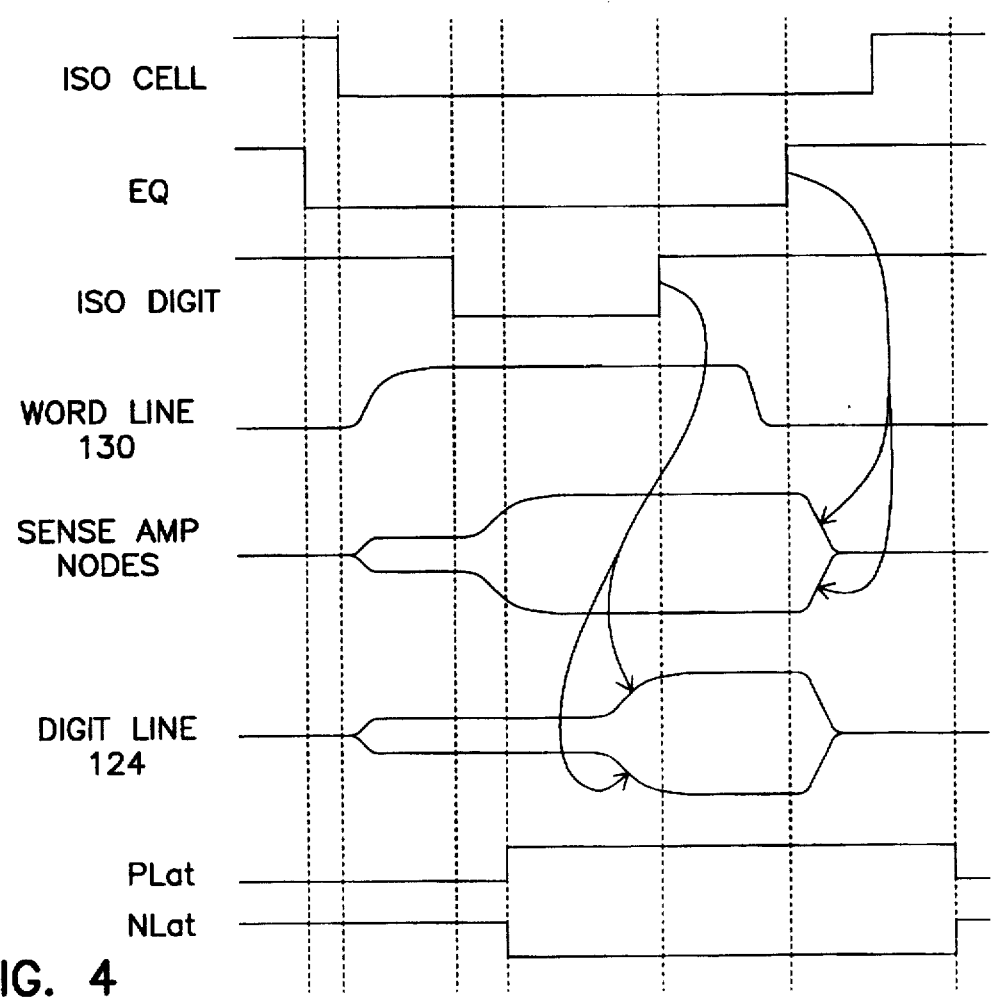
FIG. 4 is a timing diagram of the circuit in FIG. 3.

Referring to FIG. 4, to sense data stored on a memory cell, the digit line 124 and the cell plate are equalized by activating the gate of transistor 139 (EQ). As stated above, the cell plate is held to Vcc/2, as such the digit line is also held to Vcc/2. Prior to sensing stored data the equilibrate transistor 139 is turned off. Isolation transistor 134 is then turned off by lowering its gate voltage (ISO Cell) to isolate node 137 of the sense amps from the cell plate 127. The voltage at node 137 is coupled down when transistor 139 is turned off. For example, the voltage on node 137 drops by approximately 20 mv when transistor 139 is turned off. Node 135, however, remains relatively unchanged because the large capacitance on digit line 124 resists the coupling effect of transistor 139 and maintains a relatively stable voltage. It will be understood, therefore, that a small differential voltage is immediately imparted between the sense amp nodes 135 and 137 when transistor 139 is turned off. Because the typical differential resulting from data stored on a memory cell is approximately 100 mv, a differential of 20 mv resulting from coupling is significant and must be addressed, as explained below. With the cell plate isolated, one of the access transistors 128(0)-(n) is selectively activated by raising the corresponding word line 130(0)-(n). The charge, or lack of charge, stored in the memory cell is shared with the digit line and sense amp nodes. The change in the voltage on the digit line is dependent upon the charge stored in the memory cell, typically this voltage differential is approximately ±100 mv.

After the charge has been coupled to the digit line, isolation transistor 132 is turned off by lowering its gate voltage (ISO Digit) to isolate node 135 from the digit line. By isolating node 135 from the digit line 124, the capacitance of digit line 124 is eliminated and node 135 will be coupled down by the same amount that node 137 was coupled down. The total differential between sense amp nodes 135 and 137 is equal, therefore, to the charge stored upon the selected memory cell.

The sense amps are then strobed using NLat and PLat to drive node 135 to the appropriate supply level, as known to one skilled in the art. That is, if node 135 is above the equilibrate level, the node is driven to Vcc and if node 135 is below the equilibrate level it is driven to ground. Isolation transistor 132 is then re-activated by raising ISO Digit so that the entire digit line 124 can go to the appropriate power rail and the memory cell can be refreshed. After word line 130 returns to a low level, the equilibrate transistor can be re-activated to insure that both nodes of the sense amps and the digit line are at a stable equivalent voltage near Vcc/2 prior to activating isolation transistor 134 (ISO Cell). Connecting nodes 135 and 137 through transistor 139 while the sense amps are activated will result in a crossing current in the sense amps. This crossing current can be relatively large and economically undesirable. It will be understood that when one sense amp node is originally at Vcc and the other is at ground, the resulting equilibrate level will be near Vcc/2. The bias level of cell plate 127, therefore, remains substantially unaffected. The present invention maintains the memory cell differential voltage over a wide change in supply voltage without substantial lose in cell margin. The related art loses cell margin in the supply voltage changes after data has been written to a memory cell because the reference voltage was independently based on the supply voltage. In the present invention, the reference voltage and the memory cell both depend upon the cell plate, so that changes in the reference voltage are reflected on the digit line and cell margin is not effected.

Figure 5:
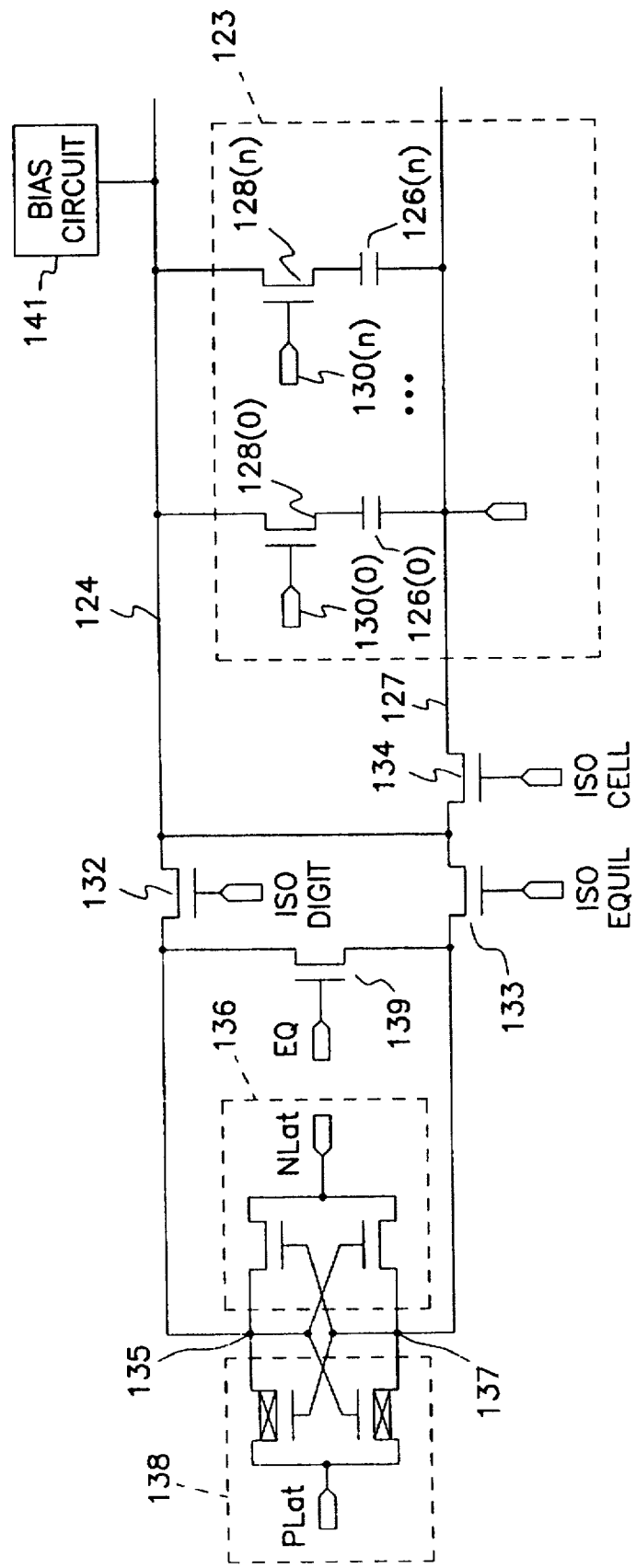
FIG. 5 is an alternate schematic of a sensing circuit of the present invention.

Alternatively, as shown in FIG. 5, a different equilibration technique can be employed. Isolation transistor 133 can be used to selectively connect node 137 to the digit line 124 to equilibrate the sense amps by forcing node 137 to its opposite state. That is, by first isolating node 135 from the digit line 124 and then activating transistor 133, the sense amps will force the voltage on the digit line to change its state. If, for example, the digit line is a "one" when transistor 133 is activated, the voltage on the digit line will be forced to transition low by the n-sense amp. It will be understood that by holding node 135 constant and using transistor 133, crossing currents are avoided. A trigger or tracking circuit (not shown) can be used to latch the voltage at a level near Vcc/2. One embodiment would be to use a timing circuit to turn on equilibrate transistor 139 and turn off the sense amps 136 and 138.

Figure 6:
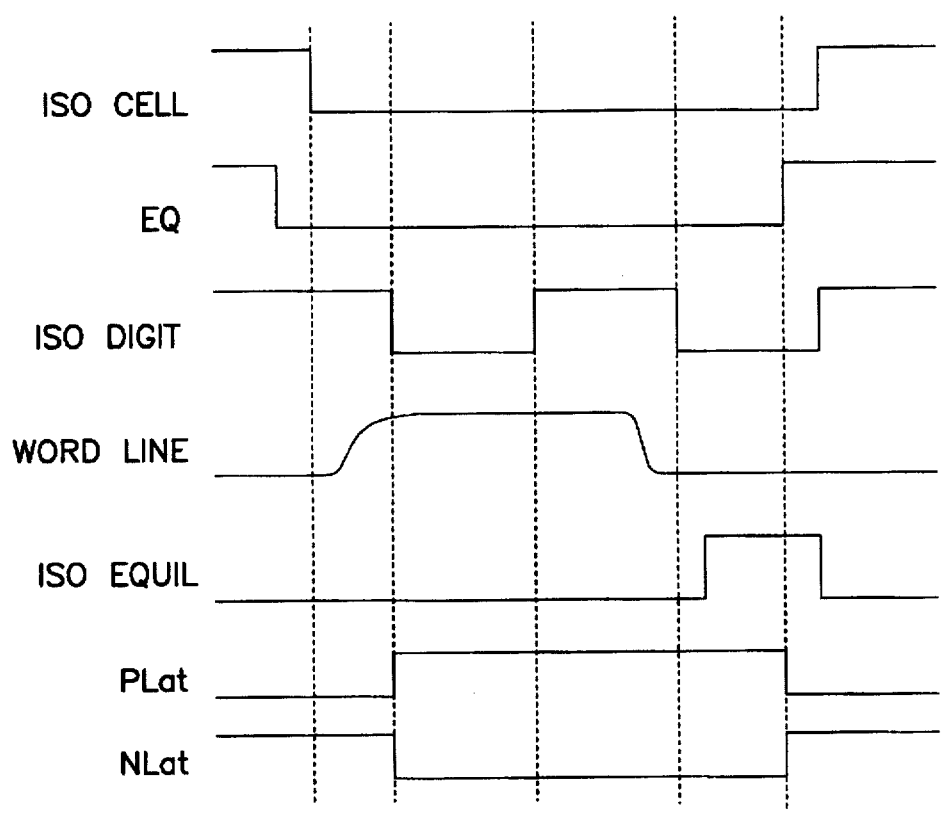
FIG. 6 is a timing diagram of the circuit in FIG. 5.

FIG. 6 illustrates the timing of this equilibrate circuit. Equilibrate transistor 139 is turned off by lowering its gate voltage (EQ). The isolation transistor 134 is turned off by lowering its gate (ISO Cell) to isolate the cell plate from the circuit. A word line 130 is raised to access a memory cell 126 and transistor 132 is de-activated by lowering its gate voltage (ISO Digit). The sense amps are strobed using NLat and PLat and transistor 132 is re-activated to refresh the memory cell. After the word line has returned low, transistor 132 is turned off to isolate digit line 124 from node 135. Transistor 133 is activated by raising its gate voltage (ISO Equil) and node 137 is connected to the digit line. The sense amps will force the digit line to begin to change states by either charging or discharging the digit line. When the voltage on the digit line is approximately Vcc/2 a timing or trigger circuit will activate equilibrate transistor 139 and turn off the sense amps. Both nodes 135 and 137 are therefore equalized and transistors 132 and 134 are activated. Finally, transistor 133 is turned off and the bias level of cell plate 127 remains substantially unaffected.

An optional bias circuit 141 is shown in FIG. 3. This circuit can be used to bias the digit line 142 to a voltage level of Vcc/2. By activating transistors 132 and 139 the nodes of the sense amps could be equilibrated to Vcc/2 prior to activating transistor 134. This equilibrate option requires additional die area and is therefore economically less desirable then the other equilibrate circuits.

Figure 7:
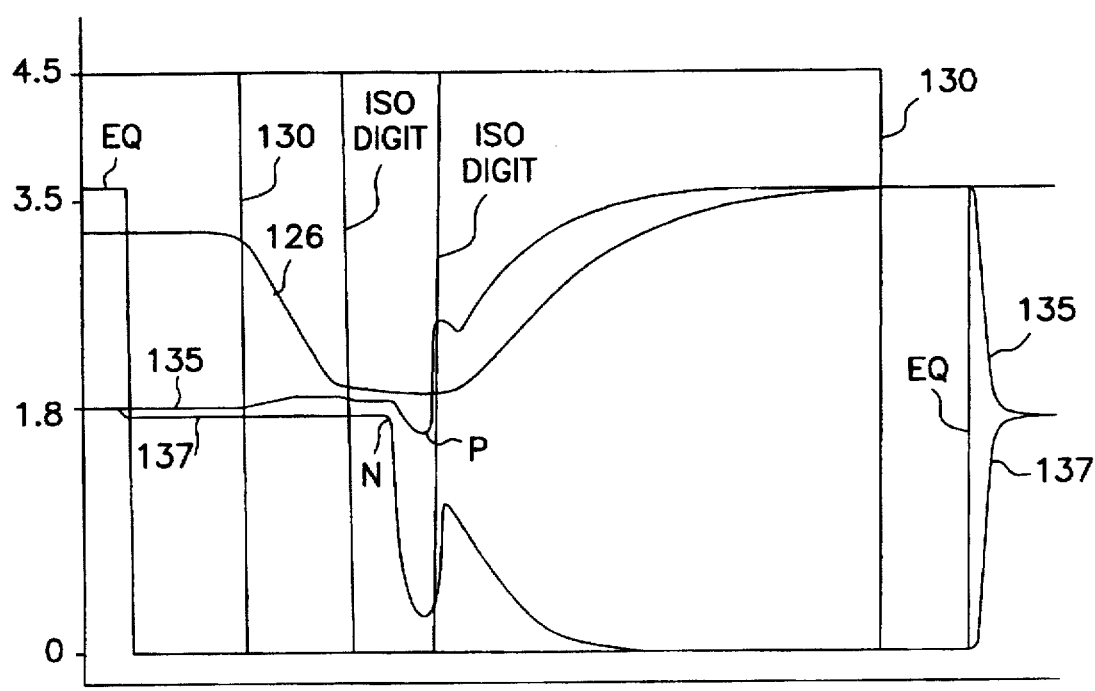
FIG. 7 is a detailed diagram of a sensing operation.

FIG. 7 is a more detailed diagram of a sensing operation on a selected memory cell which contains data stored as a "one" in the circuit of FIG. 3. It can be seen that prior to the gate of transistor 139 (EQ) falling from Vcc (3.6 volts) the sense amp nodes 135 and 137 are equalized at 1.8 volts (Vcc/2). Node 137 is coupled low when EQ goes low, thereby, creating a small differential between nodes 135 and 137. One of the memory cells 126 is selected by raising its associated word line 130. The charge stored on the memory cell is shared with the digit line 124 and node 135. The capacitance of the digit line is higher than the capacitance of the memory cell, thus the voltage of node 135 only increases by a fraction of the drop in voltage on the memory cell. Transistor 132 is turned off by lowering the ISO Digit line. As a result, node 135 is coupled low and the differential voltage between the sense amp nodes reflects a true value of the memory cell charge. After the sense amps are electrically isolated from the digit line, the n-sense amp 136 is strobed (shown as point N) and then the p-sense amp 138 is strobed (shown as point P). Note that node 135 is coupled low after the n-sense amp is strobed, but is pulled high when the p-sense amp is strobed. Transistor 132 is re-activated to connect node 135 to the digit line and memory cell 126. Both nodes of the sense amps are coupled high when the ISO Digit line goes high. Node 135 is pulled high by the p-sense amp and node 137 is pulled low by the n-sense amp. The memory cell is refreshed during the time that both transistor 132 and transistor 130 are activated. That is, the voltage on memory cell 126 is pulled to Vcc to re-charge the cell. It will be recognized that the gate voltages on transistors 132 and 130 are connected to a pump voltage which has a high level above Vcc, as known to one skilled in the art. The EQ line returns high to activate transistor 139 and nodes 135 and 137 are equilibrated to Vcc/2 prior to connecting node 137 to the cell plate.

Figure 8:
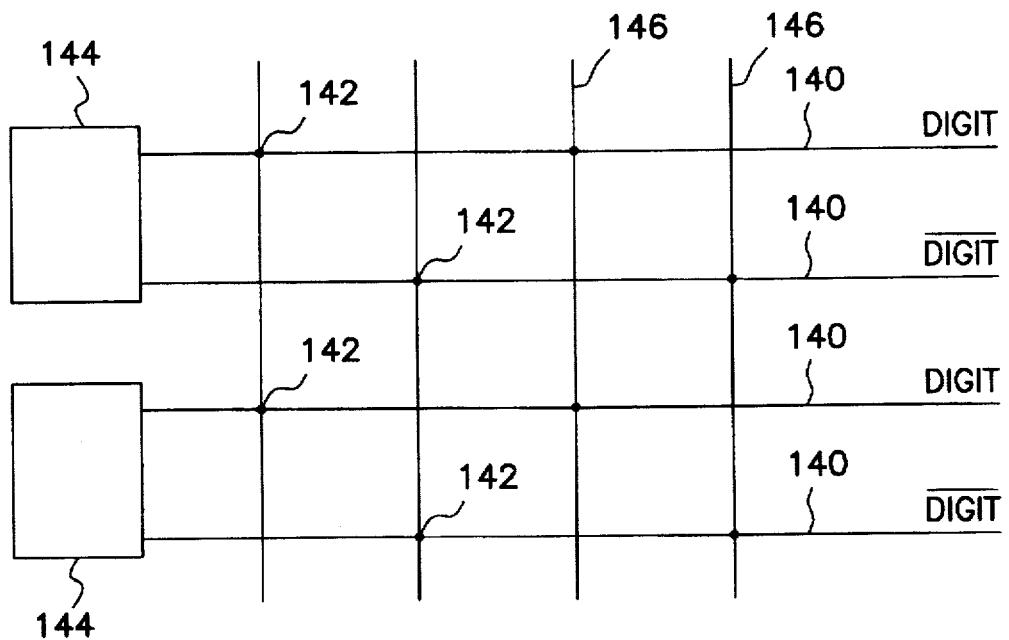
FIG. 8 is a simplified layout of a related memory circuit.
Figure 9:
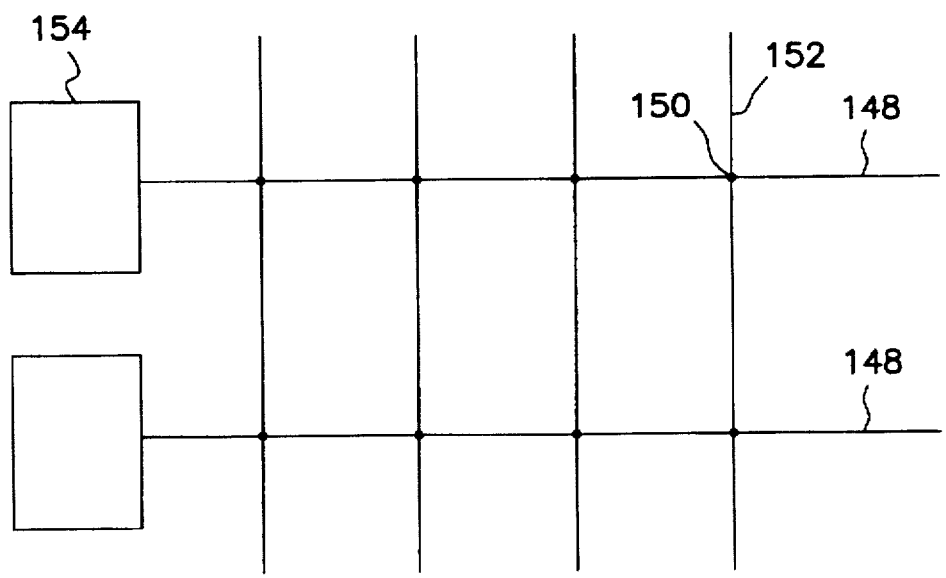
FIG. 9 is a simplified layout of a memory circuit incorporating the present invention.

By using the existing cell plate as a reference for the sense amps, the number of digit lines needed for a given amount of memory can be reduced. Further the spacing needed to connect the memory cells to the digit lines is reduced, thereby allowing for the compression of memory cells. Referring to FIG. 8, the related integrated circuit uses two digit lines 140 to connect memory cells 142 to each sense amp 144. The memory cells are arranged such that the intersection of every-other row line 146 and every-other digit line have a memory cell 142. Each sense amp 144 can, therefore, selectively sense four different memory cells in this illustration. It can be seen that any reductions in memory cell size cannot be fully realized do to the layout spacing requirements. In contrast, FIG. 9 illustrates an integrated circuit incorporating the cell plate biasing of the present invention. Memory cells 150 are located at each intersection of digit lines 148 and row lines 152. Sense amp circuits 154 are biased using the cell plate, as described above, and can selectively sense four different memory cells in this illustration.

By eliminating the second digit line, the spacing of the memory cells can be greatly reduced. The present invention allows the use 6 $F^2$ size memory cells where the conventional circuit used 8 $F^2$ memory cells, where F is the device feature size as known by one skilled in the art.

Conclusion

An integrated circuit dynamic memory which requires less digit lines has been described. The integrated circuit uses one digit line and the memory cell plate for sensing charges stored on memory cell capacitors. Because the cell plate is a pre-existing structure in the integrated circuit, the elimination of one digit line allows the miniaturization of memory cells and associated circuits to be fully exploited. Three circuits have been described which could be used to equalize the sense amp nodes prior to sensing a memory cell charge. By using the cell plate as a reference, a full differential is maintained and no cell margin is lost due to variations in supply voltage.

What is claimed is:

1. An integrated circuit comprising:
   a plurality of memory cell capacitors having first and second plates, the first plate being formed as a common plate;
   a plurality of access devices connected to the plurality of memory cell capacitors and a digit line, each for selectively connecting the second plate of one of the plurality of memory cell capacitors to the digit line;
   a sense amplifier circuit selectively connected to the digit line and having a node selectively connected to the common plate; and
   an equilibrate circuit for equilibrating the sense amplifier circuit, the equilibrate circuit comprises a bias circuit connected to the digit line.

2. The integrated circuit of claim 1 further comprising:
   an isolation circuit electrically located between the node of the sense amplifier circuit and the common plate for selectively connecting the sense amplifier circuit to the common plate.

3. The integrated circuit of claim 1 wherein the equilibrate circuit comprises a transistor having its source connected to the node and its drain connected to a second node of the sense amplifier circuit.

4. The integrated circuit of claim 1 wherein the equilibrate circuit comprises a transistor having its source connected to the node and its drain connected to the digit line.

5. The integrated circuit of claim 1 further comprising:
   an isolation circuit electrically located between a second node of the sense amplifier circuit and the digit line for selectively connecting the sense amplifier circuit to the digit line.

6. A dynamic memory integrated circuit comprising:
   an array of memory cell capacitors arranged in rows and columns, each of the memory cell capacitors of the array having first and second plates, the first plates being formed as a common plate between two or more columns;
   a plurality of access transistors having a gate connected to a word line, each for selectively connecting the second plate of one of the plurality of memory cell capacitors of a column to a digit line;
   a sense amplifier having a first node and a second node;
   an equilibrate circuit for equilibrating the sense amplifier, the equilibrate circuit comprises a bias circuit connected to the digit line;
   an isolation circuit electrically located between the first node of the sense amplifier and the common plate for selectively connecting the sense amplifier to the common plate; and
   an isolation circuit electrically located between the second node of the sense amplifier and the digit line for selectively connecting the sense amplifier to the digit line.

7. The dynamic memory integrated circuit of claim 6 wherein the equilibrate circuit is connected between the first node and the second node of the sense amplifier.

8. The dynamic memory integrated circuit of claim 7 wherein the equilibrate circuit comprises a transistor having its source connected to the first node and its drain connected to the second node of the sense amplifier circuit.

9. The dynamic memory integrated circuit of claim 7 wherein the equilibrate circuit comprises a transistor having its source connected to the first node and its drain connected to the digit line.

10. A method of sensing data stored in a dynamic memory cell, the method comprising the steps of:

connecting a first node of a sense amplifier via an isolation device to a memory cell common plate having a common plate bias voltage;

electrically connecting a second node of the sense amplifier to a digit line via an isolation device;

imparting a differential voltage between the common plate bias voltage and a digit line voltage; and sensing the differential voltage using the sense amplifier.

11. A method of sensing data stored in a plurality of dynamic memory cell capacitors having a first plate and a common plate, the method comprising the steps of:

equilibrating a sense amplifier circuit having a first node selectively connected to the common plate and a second node selectively connected to a digit line;

electrically isolating the first node of the sense amplifier circuit from the common plate; and sensing the data stored in a dynamic memory cell capacitor.

12. The method of claim 11 wherein the step of sensing the data stored in the dynamic memory cell capacitor further comprises the steps of:

selectively connecting a dynamic memory cell capacitor to the digit line;

electrically isolating the second node of the sense amplifier circuit from the digit line; and using the sense amplifier circuit, sensing a differential voltage between the first node and the second node.

13. The method of claim 11 where the step of equilibrating the sense amplifier circuit comprises the steps of:

activating a transistor having its source connected to the first node of the sense amplifier and its drain connected to the second node of the sense amplifier; and connecting the first node to a common plate bias voltage provided on the common plate.

14. The method of claim 11 where the step of equilibrating the sense amplifier circuit comprises the steps of:

electrically isolating the second node of the sense amplifier from the digit line;

activating a transistor having its source connected to the first node of the sense amplifier and its drain connected to the digit line;

electrically connecting the second node to the digit line; and connecting the first node to a common plate bias voltage provided on the common plate.

* * * * *